United States Patent [19]
Magee et al.

[11] 3,972,032
[45] July 27, 1976

[54] MEMORY SYSTEM USING ION IMPLANTED PHOTODICHROIC MATERIALS

[75] Inventors: Thomas J. Magee, Belmont; Matt Lehmann, Menlo Park, both of Calif.

[73] Assignee: Stanford Research Institute, Menlo Park, Calif.

[22] Filed: Sept. 9, 1974

[21] Appl. No.: 504,058

[52] U.S. Cl. .................. 340/173 CC; 340/173 CR
[51] Int. Cl.² .................. G11C 11/42; G11C 13/04
[58] Field of Search ............... 340/173 CC, 173 CR

[56] References Cited
UNITED STATES PATENTS

| | | | |
|---|---|---|---|
| 2,901,662 | 8/1959 | Nozick | 340/173 CC |
| 3,720,926 | 3/1973 | Schneider | 340/173 CC |

*Primary Examiner*—Terrell W. Fears
*Attorney, Agent, or Firm*—Lindenberg, Freilich, Wasserman, Rosen & Fernandez

[57] ABSTRACT

There is provided a method and means for establishing storage sites in photodichroic materials using ion implantation.

6 Claims, 2 Drawing Figures

MEMORY SYSTEM USING ION IMPLANTED PHOTODICHROIC MATERIALS

BACKGROUND OF THE INVENTION

This invention relates to improvements in photodichroic material information storage systems.

It has been known that crystals of photodichroic alkali halides, for example sodium fluoride, (NaF), can have color centers which can be manipulated by illumination with polarized ultraviolet light for the purpose of writing information therein, and can be read with polarized visible light for the purpose of reading information therefrom. However, the sensitivity of this storage arrangement, that is the ability to read what has been stored leaves much to be desired.

OBJECTS AND SUMMARY OF THE INVENTION

An object of this invention is to provide a method and means for treating a photodichroic alkali halide whereby readability of stored information is considerably improved.

Yet another object of this invention is the provision of a method and means for treating photodichroic alkali halides whereby their use for information storage becomes practical.

The foregoing and other objects of the invention may be achieved by controlling the depth of color centers in photodichroic materials, using ion implantation, whereby activated depths of microns may be achieved. These color centers can be rendered light absorptive by illumination with polarized UV and then read with visible light. The smaller the depth of the color centers, the greater the absorption of the reading light and therefore better reading capability is provided. Stated another way, the reading light which is applied to the crystal of the photodichroic material is modulated by the stored information. Since modulation depth is a measure of holographic diffraction efficiency in absorptive media, it is necessary to maximize this value. The theoretical efficiency of thin absorption holograms is approximately twice that obtained with thick holograms. The thickness of the absorption hologram is determined by the depth of the implanted color centers and thus, in accordance with this invention the color center depth is made minimal resulting in a thin and more efficient absorption hologram.

DESCRIPTION OF THE PREFERRED EMBODIMENTS

Figure 1:
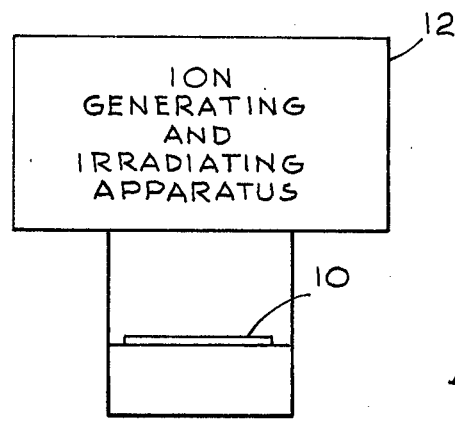
FIG. 1 is a schematic diagram illustrating ion implantation of a photodichroic material crystal, in accordance with this invention.

In accordance with this invention photodichroic alkali halide crystals, for example, sodium fluoride crystals, are cleaved to a thickness of from 200 to 500 microns. Then, as schematically illustrated in FIG. 1, a crystal is placed within the target area of ion generating and radiating apparatus 12. Such apparatus for effectuating ion implantation is well known and commercially available. The preferred source of ions constitutes a source of lithium ions, and, by way of illustration, and not to be construed as a limitation upon the invention, the crystal is irradiated with approximately 280-KeV lithium ions to a depth of 0.96 $\mu$m. The ion concentration varies with the depth penetration and is a function of accelerator energy and irradiation time. Again, as a result of the previously indicated irradiation, the depth of the principle concentration of color centers has been calculated to be approximately 1 $\mu$m giving the crystal a light pink color.

Figure 2:
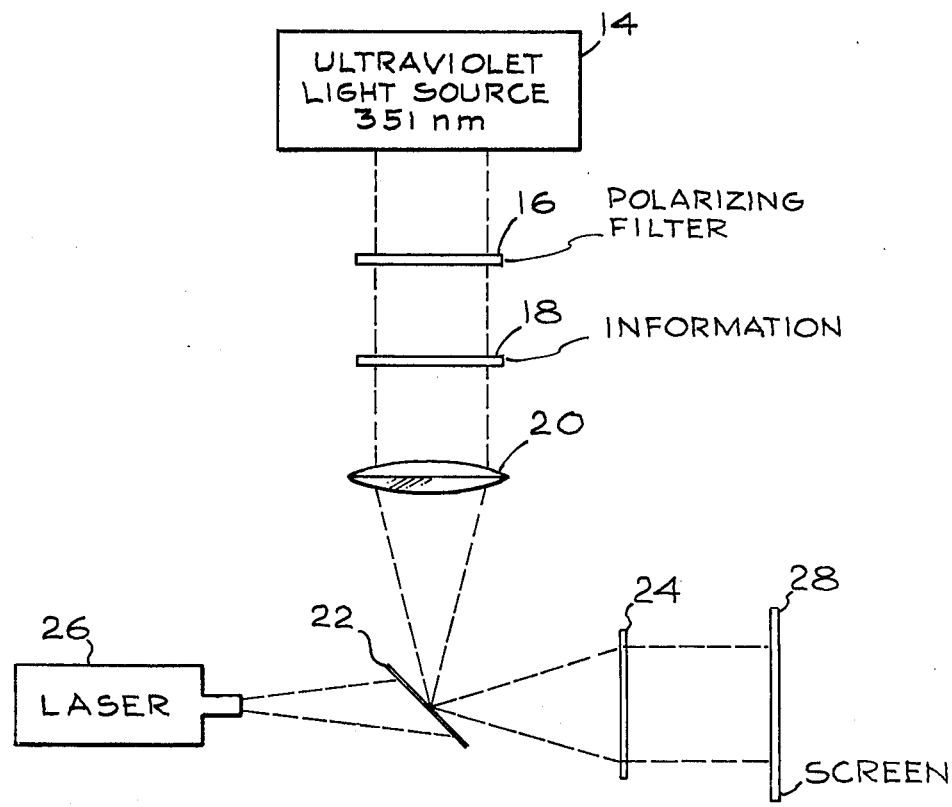
FIG. 2 is a schematic diagram illustrating a system for writing information on and reading information from the photodichroic material.

After the ion irradiation the crystal can then be used for information storage in an arrangement such as is schematically illustrated in FIG. 2. It is believed that the theory whereby the photodichroic material can be used for data storage is as follows. The ion irradiation is believed to form F centers that consist of an electron trapped in a negative ion vacancy. F centers create a light absorption band peaking at 341 nanometers (nm). When F centers are exposed to polarized light at this wavelength, they combine to form M and $M_f$ centers. The M centers are formed by pairs of nearest-neighbor F centers and can be induced to reorient with light in the F absorption band when the electric vector of the light has a component parallel to the dipole moment of the M absorption centers. This moment is parallel to the diagonal of the crystal face i.e., along either the 011 or $\overline{0}11$ axis of the cubic crystal. $M_f$ centers are also created but have absorption spectra closely approximating F-band absorption, so that they are not readily apparent with the spectrophotometer.

Now, referring to FIG. 2, a source of ultraviolet light, 14, having a frequency on the order of 343 nm, illuminates a vertical polarizing filter 16. Vertically polarized UV light which passes through the filter falls upon what may be called a page of information 18. This comprises a transparency of the information to be recorded. It will be appreciated that the entire information on a page may be recorded simultaneously, or information in analog or digital form may be recorded sequentially, as desired.

The information modulated and polarized UV light is then focused by a lens 20 so that a half silvered mirror 22 can reflect the information carrying light onto a photodichroic crystal which has been irradiated with ions.

After an exposure on the order of 50 millijoules the information is recorded on the crystal.

Thereafter, if it is desired to read the information on the crystal, a source of visible light, such as a laser 26, which may have a light output frequency on the order of 514 nm, for example, is used to illuminate the photodichroic crystal 24. This can be done through the half silvered mirror, or the mirror can be removed. The information which has been stored in the crystal will then be displayed on the screen 28.

The visible light will be absorbed wherever the polarized UV light fall has operated on the crystal, otherwise it will be transmitted through the crystal. It should be noted that the read out with the laser light is nondestructive. If it is desired to erase the information stored on the crystal, then all that is required is to illuminate the crystal with unpolarized ultraviolet light with a frequency on the order of 340 nm. This may be simply accomplished by removing the polarizing filter 16 and information page 18 from between the UV source 14 and the crystal 24. Thereafter, fresh information may be stored in the crystal in the manner described.

There has accordingly been shown hereinabove a novel and useful method and means for improving the sensitivity and depth of modulation attainable of photodichroic material used as a storage medium.

The embodiments of the invention in which an exclusive property or privilege is claimed are defined as follows:

1. A method of controllably implanting storage sites in photodichroic alkali halide material comprising
    irradiating the surface of a slab of said material with ions having a predetermined energy for a predetermined time to achieve a predetermined depth of storage site implantation.

2. A method as recited in claim 1 wherein said photodichroic alkali halide comprises sodium fluoride and said ions are lithium ions.

3. A system for improving the utility of photodichroic alkali halide material as a storage medium comprising
    slicing a slab of said material on the order of 200 to 500 microns thick, and
    irradiating a surface of said slab with ions having a predetermined energy, for a predetermined time to achieve a predetermined depth penetration.

4. A storage medium comprising a slab of a photodichroic alkali halide material having a thickness dimension of between 300 to 500 microns, and having ion implanted storage centers located below one surface thereof at a depth on the order of microns, in proportion to the predetermined energy of the ion species.

5. An improved storage medium as recited in claim 4 wherein said photodichroic alkali halide is sodium fluoride.

6. An improved storage medium as recited in claim 4 wherein said ion implanted storage center is loaded at a depth on the order of 0.96 $\mu$m.

* * * * *